US009909032B2

(12) United States Patent
Palanisamy Chinnathambi et al.

(10) Patent No.: US 9,909,032 B2
(45) Date of Patent: Mar. 6, 2018

(54) COMPOSITION AND METHOD FOR POLISHING MEMORY HARD DISKS

(71) Applicant: Cabot Microelectronics Corporation, Aurora, IL (US)

(72) Inventors: Selvaraj Palanisamy Chinnathambi, Taman Jurong (SG); Michael White, Ridgefield, CT (US)

(73) Assignee: Cabot Microelectronics Corporation, Aurora, IL (US)

( * ) Notice: Subject to any disclaimer, the term of this patent is extended or adjusted under 35 U.S.C. 154(b) by 129 days.

(21) Appl. No.: 14/156,201

(22) Filed: Jan. 15, 2014

(65) Prior Publication Data

US 2015/0197669 A1    Jul. 16, 2015

(51) Int. Cl.

| | |
|---|---|
| *C09G 1/02* | (2006.01) |
| *H01L 21/321* | (2006.01) |
| *H01L 21/306* | (2006.01) |
| *B24B 1/00* | (2006.01) |
| *C09G 1/00* | (2006.01) |
| *C09G 1/04* | (2006.01) |
| *C09C 1/06* | (2006.01) |
| *C09K 13/00* | (2006.01) |
| *C09K 13/06* | (2006.01) |
| *G11B 5/84* | (2006.01) |
| *C09C 1/30* | (2006.01) |

(52) U.S. Cl.
CPC ............... *C09G 1/02* (2013.01); *B24B 1/00* (2013.01); *C09C 1/06* (2013.01); *C09C 1/309* (2013.01); *C09C 1/3054* (2013.01); *C09C 1/3072* (2013.01); *C09G 1/00* (2013.01); *C09G 1/04* (2013.01); *C09K 13/00* (2013.01); *C09K 13/06* (2013.01); *G11B 5/8404* (2013.01); *H01L 21/30625* (2013.01); *H01L 21/3212* (2013.01); *C01P 2004/64* (2013.01)

(58) Field of Classification Search
None
See application file for complete search history.

(56) References Cited

U.S. PATENT DOCUMENTS

| | | | |
|---|---|---|---|
| 5,196,353 A | 3/1993 | Sandhu et al. | |
| 5,352,277 A | 10/1994 | Sasaki | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,149,696 A | 11/2000 | Jia | |
| 6,551,175 B2 | 4/2003 | Koichi et al. | |
| 6,620,216 B2 | 9/2003 | Oshima et al. | |
| 6,720,264 B2 | 4/2004 | Sahota et al. | |
| 6,805,812 B2 * | 10/2004 | Fang | 252/79.1 |
| 6,896,591 B2 * | 5/2005 | Chaneyalew | C09K 3/1463 451/287 |
| 7,744,666 B2 * | 6/2010 | Kurata et al. | 51/306 |
| 8,157,877 B2 * | 4/2012 | Ikeda et al. | 51/309 |
| 8,778,217 B2 * | 7/2014 | Kimura | 252/79.4 |
| 2004/0083656 A1 | 5/2004 | Hagihara et al. | |
| 2007/0037892 A1 | 2/2007 | Belov | |
| 2008/0057716 A1 * | 3/2008 | Yamashita | 438/693 |
| 2010/0009537 A1 * | 1/2010 | Balasubramaniam | C09G 1/02 438/692 |
| 2012/0252214 A1 | 10/2012 | Kamimura | |

FOREIGN PATENT DOCUMENTS

| | | | | |
|---|---|---|---|---|
| EP | 1 211 717 A1 | | 6/2002 | |
| WO | WO2007069488 | * | 6/2007 | ........... H01L 21/304 |

OTHER PUBLICATIONS

Korean Intellectual Property Office as ISA, International Search Report issued in connection with Patent Application No. PCT/US2015/010426 dated Mar. 31, 2015.

* cited by examiner

*Primary Examiner* — Jiong-Ping Lu
(74) *Attorney, Agent, or Firm* — Thomas Omholt; Erika S. Wilson

(57) ABSTRACT

The invention provides a chemical-mechanical polishing composition containing aluminate-modified silica particles, a polyacrylamide, a heterocyclic film-forming agent, and water. The invention also provides a method of chemically-mechanically polishing a substrate, especially a nickel-phosphorous substrate, by contacting a substrate with a polishing pad and the chemical-mechanical polishing composition, moving the polishing pad and the polishing composition relative to the substrate, and abrading at least a portion of the substrate to polish the substrate.

7 Claims, No Drawings

COMPOSITION AND METHOD FOR POLISHING MEMORY HARD DISKS

BACKGROUND OF THE INVENTION

The demand for increased storage capacity in memory or rigid disks and the trend towards miniaturization of memory or rigid disks (due to the requirement for smaller hard drives in computer equipment) continues to emphasize the importance of the memory or rigid disk manufacturing process, including the planarization or polishing of such disks for ensuring maximal performance. While there exist several chemical-mechanical polishing (CMP) compositions and methods for use in conjunction with semiconductor device manufacture, few conventional CMP methods or commercially available CMP compositions are well-suited for the planarization or polishing of memory or rigid disks.

The term "memory or rigid disk" refers to any magnetic disk, hard disk, rigid disk, or memory disk for retaining information in electromagnetic form. The memory or rigid disk typically has a surface that comprises nickel-phosphorus, but the memory or rigid disk surface can comprise any other suitable material. The planarity of the memory or rigid disks must be improved, as the distance between the recording head of a disk drive and the surface of the memory or rigid disk has decreased with improvements in recording density that demand a lower flying height of the magnetic head with respect to the memory or rigid disk. In order to permit a lower flying height of the magnetic head, improvements to the surface finish of the memory or rigid disk are required.

Improvements to the surface finish of the memory or rigid disk require the reduction of scratches and micro defects caused by abrasive particles. It has been hypothesized that frictional forces generated between a polishing pad and a substrate being polished leads to increased scratching and micro defects. However, the presence of additives intended to reduce frictional forces typically leads to agglomeration of abrasive particles, with a consequent increase in scratching and micro defects. Accordingly, there is a need in the art for polishing compositions exhibiting reduced scratching and micro defects and also exhibiting good surface topography and practical removal rates.

BRIEF SUMMARY OF THE INVENTION

The invention provides a chemical-mechanical polishing composition comprising (a) about 0.001 wt. % to about 10 wt. % of aluminate-modified silica particles, (b) about 1 ppm to about 1000 ppm of a polyacrylamide, (c) optionally, a heterocyclic film-forming agent, and (d) water, wherein the polishing composition has a pH of about 1 to about 7.

The invention also provides a method of chemically-mechanically polishing a substrate, which method comprises (i) providing a substrate, (ii) providing a polishing pad, (iii) providing a polishing composition comprising (a) about 0.001 wt. % to about 10 wt. % of aluminate-modified silica particles, (b) about 1 ppm to about 1000 ppm of a polyacrylamide, (c) optionally, a heterocyclic film-forming agent, and (d) water, wherein the polishing composition has a pH of about 1 to about 7, (iv) contacting a surface of the substrate with the polishing pad and the polishing composition, and (v) abrading at least a portion of the surface of the substrate to remove at least a portion of the surface of the substrate to polish the surface of the substrate.

DETAILED DESCRIPTION OF THE INVENTION

The invention provides a chemical-mechanical polishing composition comprising (a) about 0.001 wt. % to about 10 wt. % of aluminate-modified silica particles, (b) about 1 ppm to about 1000 ppm of a polyacrylamide, (c) optionally, a heterocyclic film-forming agent, and (d) water, wherein the polishing composition has a pH of about 1 to about 7.

The polishing composition comprises aluminate-modified silica particles. The silica particles can be wet-process silica particles, for example, condensation-polymerized silica particles or silica particles provided in the form of a silica sol. The silica particles can be modified by treating the wet-process silica particles with a source of aluminum ions. The source of aluminum ions can be any suitable aluminum compound, for example, aluminum nitrate. The treatment of the silica particles with an aluminum compound can be carried out in water, for example, in an aqueous solution of potassium hydroxide. An example of a suitable wet-process silica is the Nalco 1030C product (Nalco Chemical). Non-limiting example of suitable commercially available aluminate-modified silica particles include Snowtex-O (Nissan Chemical), Nexsil 20ZKA (Nyacol), TX13628, TX15932, and TX13573 (Nalco Chemical), and Bindzil DP5110 (Akzo Nobel).

The aluminate-modified silica particles can have a maximum in a particle size distribution of about 5 nm or more, e.g., about 10 nm or more, about 15 nm or more, about 20 nm or more, about 25 nm or more, about 30 nm or more, about 35 nm or more, or about 40 nm or more. Alternatively, or in addition, the aluminate-modified silica particles can have a maximum in a particle size distribution of about 60 nm or less, e.g., about 55 nm or less, or about 50 nm or less, or about 45 nm or less. Thus, the aluminate-modified silica particles can have a maximum in a particle size distribution bounded by any two of the above endpoints. For example, the aluminate-modified silica particles can have a maximum in a particle size distribution of about 5 nm to about 60 nm, about 10 nm to about 60 nm, about 15 nm to about 60 nm, about 20 nm to about 60 nm, about 20 nm to about 55 nm, about 20 nm to about 50 nm, about 20 nm to about 45 nm, about 25 nm to about 60 nm, about 25 nm to about 55 nm, about 25 nm to about 50 nm, about 30 nm to about 60 nm, about 30 nm to about 55 nm, about 30 nm to about 50 nm, about 35 nm to about 60 nm, about 35 nm to about 55 nm, about 35 nm to about 50 nm, about 40 nm to about 60 nm, or about 40 nm to about 55 nm.

The polishing composition can comprise any suitable amount of the aluminate-modified silica particles. Typically, the polishing composition can contain about 0.01 wt. % or more, e.g., about 0.05 wt. % or more, about 0.1 wt. % or more, about 0.2 wt. % or more, about 0.3 wt. % or more, about 0.4 wt. % or more, or about 0.5 wt. % or more, of the aluminate-modified silica particles. Alternatively, or in addition, the polishing composition can contain about 10 wt. % or less, e.g., about 9 wt. % or less, about 8 wt. % or less, about 7 wt. % or less, about 6 wt. % or less, about 5 wt. % or less, about 4 wt. % or less, about 3 wt. % or less, about 2 wt. % or less, or about 1 wt. % or less, of the aluminate-modified silica particles. Thus, the polishing composition can comprise silica in amounts bounded by any two of the above endpoints recited for the aluminate-modified silica particles. For example the polishing composition can comprise about 0.01 wt. % to about 10 wt. %, about 0.05 wt. % to about 8 wt. %, about 0.1 wt. % to about 6 wt. %, about 0.2 wt. % to about 4 wt. %, about 0.2 wt. % to about 2 wt. %, or about 0.3 wt. % to about 1 wt. % of the aluminate-modified silica particles.

The aluminate-modified silica particles preferably are colloidally stable. The term colloid refers to the suspension of abrasive particles in the liquid carrier. Colloidal stability refers to the maintenance of that suspension through time. In the context of this invention, an abrasive, such as the aluminate-modified silica particles, is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−(T)}/[C]≤0.5). More preferably, the value of [B]−[T]/[C] is less than or equal to 0.3, and most preferably is less than or equal to 0.1.

The chemical-mechanical polishing composition of the invention can contain any suitable liquid carrier (e.g., solvent or dispersion medium). The liquid carrier can comprise, consist essentially of, or consist of any suitable solvent or dispersion medium, including, for example, aqueous carriers (e.g., water), non-aqueous carriers (e.g., organic solvents), or mixtures thereof. In a preferred embodiment, the liquid carrier comprises about 50% or more of water in a mixture with a non-aqueous carrier. For example, the liquid carrier can comprise about 60% or more, about 70% or more, about 80% or more, or about 90% or more of water in a mixture with a non-aqueous carrier. The water may be miscible or immiscible with the non-aqueous carrier, though preferably the water is miscible with the non-aqueous carrier. The liquid carrier preferably comprises water, and more preferably the liquid carrier is water (e.g., the liquid carrier consists of water), such as de-ionized water.

The polishing composition comprises a polyacrylamide. The polyacrylamide can be any suitable polyacrylamide. The polyacrylamide typically has the structure: [—CH$_2$CH(CONH$_2$)—]$_n$ wherein n is an integer of about 7 to about 210. Typically, the polyacrylamide can have a molecular weight of about 500 g/mol or more, e.g., about 750 g/mol or more, about 1000 g/mol or more, about 2000 g/mol or more, about 3000 g/mol or more, about 4000 g/mol or more, about 5000 g/mol or more, about 6000 g/mol or more, about 7000 g/mol or more, or about 8000 g/mol or more. Alternatively, or in addition, the polyacrylamide can have a molecular weight of about 15,000 g/mol or less. e.g., about 14,000 g/mol or less, about 13,000 g/mol or less, or about 12,000 g/mol or less. Thus, the polyacrylamide can have a molecular weight bounded by any two of the above endpoints recited for the polyacrylamide. For example the polyacrylamide can have a molecular weight of about 500 g/mol to about 15,000 g/mol, about 750 g/mol to about 15,000 g/mol, about 1000 g/mol to about 15,000 g/mol, about 4000 g/mol to about 15,000 g/mol, about 8000 g/mol to about 15,000 g/mol, about 8000 g/mol to about 14,000 g/mol, about 8000 g/mol to about 13,000 g/mol, or about 8000 g/mol to about 12,000 g/mol.

Typically, the polishing composition can contain about 1 ppm or more, e.g., about 10 ppm or more, about 25 ppm or more, about 50 ppm or more, about 75 ppm or more, about 100 ppm or more, about 150 ppm or more, or about 200 ppm or more, of polyacrylamide. Alternatively, or in addition, the polishing composition can contain about 1000 ppm or less, e.g., about 900 ppm or less, about 800 ppm or less, about 700 ppm or less, about 600 ppm or less, or about 500 ppm or less, of polyacrylamide. Thus, the polishing composition can contain polyacrylamide in amounts bounded by any two of the above endpoints recited for polyacrylamide. For example the polishing composition can contain about 1 ppm to about 1000 ppm, about 25 ppm to about 900 ppm, about 50 ppm to about 800 ppm, about 75 ppm to about 700 ppm, about 100 ppm to about 600 ppm, or about 200 ppm to about 500 ppm of polyacrylamide.

The polishing composition optionally comprises a heterocyclic film-forming agent. The heterocyclic film-forming agent can be any suitable heterocyclic film-forming agent. Non-limiting examples of heterocyclic film-forming agents include 5-aminotetrazole, imidazole, benzotriazole, benzimidazole, triazole, tolyltriazole, quinaldinic acid, quinolinic acid, amino compounds, imino compounds, carboxy compounds, mercapto compounds, nitro compounds, urea compounds, and thiourea compounds, and derivatives thereof. Preferably, the heterocyclic film-forming agent is benzotriazole.

The polishing composition can contain about 1 ppm or more, e.g., about 5 ppm or more, about 10 ppm or more, about 25 ppm or more, or about 50 ppm or more, of the heterocyclic film-forming agent. Alternatively, or in addition, the polishing composition can contain about 100 ppm or less, about 90 ppm or less, about 80 ppm or less, about 70 ppm or less, about 60 ppm or less, or about 50 ppm or less, of the heterocyclic film-forming agent. Thus, the polishing composition can contain the heterocyclic film-forming agent in amounts bounded by any two of the above endpoints recited for the heterocyclic film-forming agent. For example the polishing composition can contain about 1 ppm to about 100 ppm, about 5 ppm to about 90 ppm, about 10 ppm to about 80 ppm, or about 25 ppm to about 70 ppm of the heterocyclic film-forming agent.

The polishing composition can have any suitable pH. Typically, the polishing composition can have a pH of about 1 or more, e.g., about 1.2 or more, about 1.4 or more, about 1.6 or more, about 1.8 or more, or about 2 or more. Alternatively, or in addition, the polishing composition can have a pH of about 7 or less, e.g., about 6 or less, about 5 or less, about 4 or less, about 3 or less, or about 2 or less. Thus, the polishing composition can have a pH bounded by any two of the above endpoints recited for the polishing composition. For example the polishing composition can have a pH of about 1 to about 7, e.g., about 1.2 to about 6, about 1.4 to about 5, about 1.6 to about 4, about 1.8 to about 3, or about 2 to about 3.

The polishing composition optionally comprises an oxidizing agent that oxidizes nickel-phosphorous. Preferred oxidizing agents that oxidize nickel-phosphorous are selected from the group consisting of hydrogen peroxide, urea hydrogen peroxide, peroxysulfuric acid, peroxyacetic acid, perboric acid, salts thereof, and combinations thereof. More preferably, the oxidizing agent is hydrogen peroxide. Typically, the polishing composition can contain about 0.5 wt. % or more, e.g., about 1 wt. % or more, or about 2 wt. % or more, of the oxidizing agent that oxidizes nickel-phosphorous. Alternatively, or in addition, the polishing composition can contain about 10 wt. % or less, e.g., about 8 wt. % or less, or about 6 wt. % or less, or about 4 wt. % or less, of the oxidizing agent that oxidizes nickel-phosphorous. Thus, the polishing composition can comprise an oxidizing agent that oxidizes nickel-phosphorous in amounts bounded by any two of the above endpoints recited for the oxidizing agent that oxidizes nickel-phosphorous. For example the polishing composition can comprise about 0.5 wt. % to about 10 wt. %, or about 1 wt. % to about 8 wt. %, or about 2 wt. % to about 6 wt. % of the oxidizing agent that oxidizes nickel-phosphorous.

The polishing composition optionally comprises a chelating agent. Desirably, the chelating agent is a chelating agent for nickel. The chelating agent can be any suitable chelating agent, especially any suitable chelating agent for nickel. The chelating agent preferably is chosen so that the polishing composition exhibits low dissolution behavior when in contact with a substrate comprising nickel-phosphorous. Non-limiting examples of suitable chelating agents include glycine and alanine.

Typically, the polishing composition can contain about 0.1 wt. % or more, e.g., about 0.2 wt. % or more, or about 0.3 wt. % or more, or about 0.4 wt. % or more, or about 0.5 wt. % or more, of the chelating agent. Alternatively, or in addition, the polishing composition can contain about 2 wt. % or less, e.g., about 1.8 wt. % or less, or about 1.6 wt. % or less, or about 1.4 wt. % or less, or about 1.2 wt. % or less, or about 1 wt. % or less, of the chelating agent. Thus, the polishing composition can comprise the chelating agent in amounts bounded by any two of the above endpoints recited for the chelating agent. For example the polishing composition can comprise about 0.1 wt. % to about 2 wt. %, about 0.2 wt. % to about 1.8 wt. %, about 0.3 wt. % to about 1.6 wt. %, about 0.4 wt. % to about 1.4 wt. %, or about 0.5 wt. % to about 1.2 wt. % of the chelating agent.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., aluminate-modified silica particles, polyacrylamide, optional heterocyclic film-forming agent, optional oxidizing agent that oxidizes nickel-phosphorous, optional chelating agent, etc.) as well as any combination of ingredients (e.g., aluminate-modified silica particles, polyacrylamide, optional heterocyclic film-forming agent, optional oxidizing agent that oxidizes nickel-phosphorous, optional chelating agent, etc.).

For example, the aluminate-modified silica particles can be dispersed in water. The polyacrylamide, optional heterocyclic film-forming agent, and optional chelating agent can then be added, and mixed by any method that is capable of incorporating the components into the polishing composition. The optional oxidizing agent that oxidizes nickel-phosphorous can be added at any time during the preparation of the polishing composition. The polishing composition can be prepared prior to use, with one or more components, such as the oxidizing agent that oxidizes nickel-phosphorous, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising aluminate-modified silica particles, polyacrylamide, optional heterocyclic film-forming agent, optional oxidizing agent that oxidizes nickel-phosphorous, optional chelating agent, and water. Alternatively, the aluminate-modified silica particles can be supplied as a dispersion in water in a first container, and polyacrylamide, optional heterocyclic film-forming agent, and optional chelating agent can be supplied in a second container, either in dry form, or as a solution or dispersion in water. The optional oxidizing agent that oxidizes nickel-phosphorous desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the aluminate-modified silica particles, polyacrylamide, optional heterocyclic film-forming agent, optional chelating agent, and water, with or without the optional oxidizing agent that oxidizes nickel-phosphorous, in amounts such that, upon dilution of the concentrate with an appropriate amount of water, and the optional oxidizing agent that oxidizes nickel-phosphorous if not already present in an appropriate amount, each component of the polishing composition will be present in the polishing composition in an amount within the appropriate range recited above for each component. For example, the aluminate-modified silica particles, polyacrylamide, optional heterocyclic film-forming agent, and optional chelating agent can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), along with the optional oxidizing agent that oxidizes nickel-phosphorous in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically-mechanically polishing a substrate with the polishing composition described herein. In particular, the inventive method comprises (i) contacting a substrate with a polishing pad and the chemical-mechanical polishing composition described herein, (ii) moving the polishing pad relative to the substrate with the chemical-mechanical polishing composition therebetween, and (iii) abrading at least a portion of the substrate to polish the substrate.

The substrate to be polished using the method of the invention can be any suitable substrate, especially a substrate that contains nickel-phosphorous. A preferred substrate comprises at least one layer, especially an exposed layer for polishing, comprising, consisting essentially of, or consisting of nickel-phosphorous. Particularly suitable substrates include, but are not limited to, memory or rigid disks, such as aluminum disks coated with nickel-phosphorous.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

A chemical-mechanical polishing process can be characterized in a number of ways, such as in terms of the removal rate of a substrate, the resulting surface roughness, the resulting defectivity, and the resulting edge roll-off of a substrate.

The removal rate of a substrate can be determined using any suitable technique. Examples of suitable techniques for determining the removal rate of a substrate include weighing the substrate before and after use of the inventive polishing method to determine the amount of substrate removed per unit of polishing time, which can be correlated with the removal rate in terms of thickness of substrate removed per unit of polishing time, and determining the thickness of the substrate before and after use of the inventive polishing method to directly measure the removal rate of the substrate per unit of polishing time.

One measure of defectivity is the total scratch count as defined as the sum of shallow, micro, and deep scratches on the surface of a substrate after polishing. Another measure of defectivity is the long scratch count on the surface of the substrate after polishing. Another measure of defectivity is the count of micro particles that either adhere to the surface or are embedded in the surface of a substrate that has been polished. The substrate, such as a nickel-phosphorous coated memory disk, can be inspected using optical defect scanning equipment such as the Candela 6100 and 6300 series and similar instruments available from KLA Tencor (Milpitas, Calif.). Long scratch count can be defined as the number of scratches that are long than about 2 pixels in the image obtained by use of the Candela equipment.

Desirably, the inventive polishing composition and method disclosed herein result in reduction in the total scratch count and/or in the long scratch count when used to polish substrates comprising a nickel-phosphorous coated memory disk.

The following examples further illustrate the invention but, of course, should not be construed as in any way limiting its scope.

Example 1

This example demonstrates the effect on defectivity achievable by the inventive polishing composition in the polishing of nickel-phosphorous-coated aluminum memory disks.

Similar substrates comprising nickel-phosphorous-coated aluminum memory disks were separately polished on one side with 13 different polishing compositions (Polishing Compositions 1A-1M). Each of the polishing compositions comprised aluminate-modified silica particles in water at a pH of 1.9, and Polishing Compositions 1B-1M further comprised 300 ppm of an additive as shown in Table 1.

Following polishing, the substrates were examined for total scratch counts and long scratch counts. The results are set forth in Table 1.

TABLE 1

| Polishing Composition | Additive (molecular weight) | Total scratch counts | Long scratch counts |
|---|---|---|---|
| 1A (control) | None | 60 | 25 |
| 1B (comparative) | Polyvinyl alcohol (MW 23,000 g/mol) | 40 | 11 |
| 1C (comparative) | Ethylene glycol | 54 | 11 |
| 1D (comparative) | Glycerol | 48 | 10 |
| 1E (comparative) | Polyethylene glycol 300 | 56 | 16 |
| 1F (comparative) | Polyacrylic acid (MW 3,500 g/mol) | 64 | 20 |
| 1G (comparative) | Polyacrylic acid (MW 15,000 g/mol) | 46 | 24 |
| 1H (comparative) | Polymethacrylic acid | 45 | 11 |
| 1I (comparative) | Polyvinyl alcohol (MW 50,000 g/mol) | 78 | 10 |
| 1J (comparative) | Polyvinyl alcohol (MW 90,000 g/mol) | 67 | 12 |
| 1K* (comparative) | Polyvinyl alcohol (MW 10,000 g/mol) | 16 | 4 |
| 1L (invention) | Polyacrylamide (MW 1500 g/mol) | 23 | 6 |
| 1M (invention) | Polyacrylamide (MW 10,000 g/mol) | 19 | 4 |

*colloidally unstable after 3 days

As is apparent from the results set forth in Table 1, inventive Polishing Compositions 1L and 1M, which contained polyacrylamide with molecular weights of 1500 g/mol and 10,000 g/mol, respectively, exhibited approximately 43% and 53% reductions in total scratch counts, respectively, and approximately 46% and 64% reductions in long scratch counts, respectively, as compared to Polishing Composition 1D, which contained glycerol. Even greater reduction in total scratch counts and long scratch counts were observed as compared to control Polishing Composition 1A. A substrate that was polished using Polishing Composition 1K, which contained polyvinyl alcohol with a molecular weight of 10,000 g/mol exhibited approximately the same total scratch count and long scratch count as did Polishing Compositions 1L and 1M; however Polishing Composition 1K did not exhibit colloidal stability.

Example 2

This example demonstrates the effect on defectivity achievable by the inventive polishing composition in the polishing of nickel-phosphorous-coated aluminum memory disks.

Similar substrates comprising nickel-phosphorous-coated aluminum memory disks were separately polished on one side with 3 different polishing compositions. Each of the polishing compositions comprised aluminate-modified silica particles in water at a pH of 1.9. Polishing Composition 2A (comparative) further contained 300 ppm polyvinyl alcohol with a molecular weight of 23,000 g/mol. Polishing Composition 2B (comparative) further contained 300 ppm polyacrylamide with a molecular weight of 10,000 g/mol. Polishing Composition 2C (invention) further contained 300 ppm polyacrylamide with a molecular weight of 10,000 g/mol and 63 ppm benzotriazole.

Following polishing, the substrates were examined for total scratch counts and long scratch counts. The results are set forth in Table 2.

TABLE 2

| Polishing Composition | Additive(s) (molecular weight) | Total scratch counts | Long scratch counts |
|---|---|---|---|
| 2A (comparative) | Polyvinyl alcohol (MW 23,000 g/mol) | 40 | 11 |
| 2B (comparative) | Polyacrylamide (MW 10,000 g/mol) | 19 | 4 |
| 2C (invention) | Polyacrylamide (MW 10,000 g/mol) + benzotriazole (63 ppm) | 10 | 3 |

As is apparent from the results set forth in Table 2, inventive Polishing Composition 2C, which contained polyacrylamide and benzotriazole, exhibited approximately 47% and 25% reductions in total scratch count and long scratch count, respectively, compared to Polishing Composition 2B, which contained polyacrylamide but no benzotriazole. Polishing Composition 2C exhibited approximately 75% and 73% reductions in total scratch count and long scratch count, respectively, compared to Polishing Composition 2A, which contained polyvinyl alcohol and did not contain benzotriazole.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a substrate, which method comprises:
    (i) providing a substrate,
    (ii) providing a polishing pad,
    (iii) providing a polishing composition comprising:
        (a) about 0.001 wt. % to about 10 wt. % of aluminate-modified silica particles,
        (b) about 1 ppm to about 1000 ppm of a polyacrylamide, wherein the polyacrylamide has a molecular weight of about 500 g/mol to about 15,000 g/mol,
        (c) optionally, a heterocyclic film-forming agent, and
        (d) water,
    wherein the polishing composition has a pH of about 1 to about 3, and wherein the polishing composition further comprises about 0.1 wt. % to about 2 wt. % of a chelating agent, wherein the chelating agent is selected from the group consisting of glycine and alanine,
    (iv) contacting a surface of the substrate with the polishing pad and the polishing composition, and
    (v) abrading at least a portion of the surface of the substrate to remove at least a portion of the surface of the substrate to polish the surface of the substrate, wherein the substrate comprises at least one layer of nickel-phosphorous, and wherein abrading at least a portion of the surface of the substrate removes at least some nickel-phosphorous from the surface of the substrate to polish the surface of the substrate.

2. The method of claim 1, wherein the aluminate-modified silica particles are silica particles treated with an aluminum salt and potassium hydroxide.

3. The method of claim 1, wherein the aluminate-modified silica particles in the polishing composition have a maximum in a particle size distribution of from about 5 nm to about 60 nm.

4. The method of claim 1, wherein the polishing composition comprises about 50 ppm to about 500 ppm of the polyacrylamide.

5. The method of claim 1, wherein the heterocyclic film-forming agent is present and is benzotriazole.

6. The method of claim 5, wherein the polishing composition comprises about 10 ppm to about 100 ppm of benzotriazole.

7. The method of claim 1, wherein the substrate is a nickel-phosphorous coated aluminum memory disk.

* * * * *